US005591966A

United States Patent [19]
Harada et al.

[11] Patent Number: 5,591,966
[45] Date of Patent: Jan. 7, 1997

[54] PHOTOSENSOR PACKAGE WITH DEFINED LOCATIONS FOR LENS SUPPORTING LEAD

[75] Inventors: Yoshio Harada; Hiroyuki Takamatsu, both of Kanagawa; Toshiyasu Shimada; Takanori Yamashita, both of Tokyo, all of Japan

[73] Assignees: Sony Corp.; NEC Corp., both of Japan

[21] Appl. No.: 463,858

[22] Filed: Jun. 5, 1995

[30] Foreign Application Priority Data

Jun. 10, 1994 [JP] Japan .................................. 6-152583

[51] Int. Cl.$^6$ ............................................. H04B 10/00
[52] U.S. Cl. ..................... 250/239; 250/216; 250/214.1
[58] Field of Search .................................. 250/239, 216, 250/208.1, 214 R, 214.1; 427/180, 209, 211, 212, 213, 218, 219, 224

[56] References Cited

U.S. PATENT DOCUMENTS 4,818,859  4/1989  Hough ........................................ 250/239
5,170,453  12/1992 Go et al. ..................................... 385/70

Primary Examiner—Edward P. Westin
Assistant Examiner—John R. Lee
Attorney, Agent, or Firm—Ronald P. Kananen

[57] ABSTRACT

An optical element supported to an optical element supporting lead is sealed by a package having a lens. A height t2 from the rear surface of the optical element supporting lead at the portion projected outside from the package to the rear surface of the package is set to be substantially equal to a height t1 from the surface of the optical element to a top of a lens or the difference between the heights t1 and t2 is set small. Thus, the package can be assembled into a printed circuit board or the like by an insertion machine. Moreover, a power-saving and a mass-production become possible.

20 Claims, 3 Drawing Sheets

– 5,591,966 –

PHOTOSENSOR PACKAGE WITH DEFINED LOCATIONS FOR LENS SUPPORTING LEAD

BACKGROUND OF THE INVENTION

1. Field of the Invention

The present invention relates to optical devices and particularly to an optical device in which an optical element supported on an optical element supporting lead is sealed by a package having a lens through which light to or from the optical element passed on the surface at its position opposing said optical element together with other leads, a height from the rear surface of the optical element supporting lead at its portion for supporting the optical element is set to be smaller than a height from the front surface of the optical element to a top of the lens and outer ends of the leads including the optical element supporting lead are projected from one side surface of the package.

2. Description of the Related Art

FIG. 1 of the accompanying drawings shows a remote control light-receiving module for receiving an infrared remote control signal from a remote commander.

As shown in FIG. 1, the remote control light-receiving module is composed of a remote control signal reception monolithic IC 1 on or within which a photodiode and a signal processor are formed monolithically, an optical device supporting lead 2 to a tab or pad 3 of which the remote control signal reception monolithic IC 1 is bonded by die bonding, a connect wire 4 for connecting one electrode (e.g., a ground electrode) of the remote control reception IC 1 and the optical device supporting lead 2, and a package 5 for shielding the remote control reception IC 1 on the optical device supporting lead 2 together with an end of a connect wire connection side of another lead (not shown in FIG. 1), i.e., its inner end. The package 5 is made of a transparent resin through which infrared rays are passed and has a substantially rectangular solid shape. The package 5 includes a convex spherically-shaped lens 6 formed thereon. The above shielding is made by transfer molding for example.

The lens 6 is disposed at the optimum position of the remote control reception IC 1 such that infrared rays from the remote commander after the infrared rays were modulated by the remote control signal are converged on the surface of the remote control reception IC 1.

A plurality of (e.g., two) leads (not shown) other than the optical device supporting lead 2 are connected at their one ends to electrodes of the remote control reception IC 1 through connect wires (not shown), respectively. The respective leads including the optical device supporting lead 2 are projected at their ends opposing the connect wire side from one side surface (e.g., a left side surface in FIG. 1) of the package 5.

In the package 5 of the optical device, a thickness t3 ranging from the front surface of the optical device supporting lead 2 to the top surface of the lens 6 is considerably larger than a thickness t4 ranging from the rear surface of the optical device supporting lead 2 to the rear surface of the package 5. Each of the leads including the lead 2 is formed straight in the thickness direction without being bent. Therefore, assuming that t2 is a height from the rear surface of the package 5 to the rear surface of the optical device supporting lead 2 and that t1 is a height from the front surface of the optical device supporting lead 2 to a top 6p of the lens 6, then t1>>t2 is established.

The reason that the thickness t3 ranging from the front surface of the optical device supporting lead 2 to the top 6p of the lens 6 is considerably larger than the thickness t4 ranging from the rear surface of the optical device supporting lead 2 to the rear surface of the package 5 will be described below. Since the infrared rays modulated by the remote control signal from the remote commander have to be converged and focused on the surface of the remote control reception IC 1 by the lends 6, the thickness t3 should be set to a relatively large value of 3 mm or greater, for example. If, on the other hand, the thickness ranging from the rear surface of the optical supporting lead 2 to the rear surface of the package 5 is made large, air is difficult to escape upon resin shielding. As a result, a void tends to occur. Therefore, t1>>t2 has to be established.

The remote control reception module shown in FIG. 1 is difficult to be assembled into a printed circuit board, for example, automatically and therefore cannot be mass-produced.

Specifically, the remote control reception module is assembled into devices to be remote-controlled, such as a television receiver, a tape recorder or an air conditioner and so on. To be more concrete, outer ends of respective leads of the remote control reception module have to be fitted into predetermined through-holes of a printed circuit board and soldered to the interconnection of the printed circuit board. To insert the leads of the remote reception module into the through-holes manually is contradictory to a nowadays trend in which a demand for saving manpower and for improving mass-production is increased.

The same assignee of the present application has discussed use of an insertion machine for automatically inserting leads of an electric assembly into predetermined through-holes of a printed circuit board and properly bending ends of the leads after electric assemblies, such as capacitors, resistors or the like being wrapped by taping. An example of such insertion machine called a PANASERT (a product name, manufactured by Matsushita Electric Industry Co., Ltd.) is discussed to be used to assemble the remote control reception module to a printed circuit board.

The remote control reception module shown in FIG. 1 is difficult to be assembled to the printed circuit board even by the above-mentioned insertion machine. Moreover, it is frequently observed that the remote control reception module is not correctly assembled into the printed circuit board by the above-mentioned insertion machine. Therefore, the above-mentioned insertion machine cannot be used in actual practice.

The reason for this is that, when the above-mentioned insertion machine is used, the projected positions of the respective leads projected from the side surface of the package have to become coincident with substantially the central portion in the thickness direction of the package including the lens. That is, t1=t2 should be satisfied. However, since t1>>t2, the above-mentioned insertion machine cannot be used. Therefore, the usage of such remote control reception module cannot save manpower and is not suited to mass-produce electric equipments with the module.

OBJECTS AND SUMMARY OF THE INVENTION

In view of the aforesaid aspect, it is an object of the present invention to provide an optical device in which deriving-out positions of leads from a package sealing a light-receiving element are set substantially to a central portion of a thickness of the package at the lead deriving surface.

It is another object of the present invention to provide an optical device which can be easily assembled automatically by modifying the shape and the position of the package lead.

According to an aspect of the present invention, there is provided an optical device which comprises an optical element supporting lead for supporting the optical element, and a package having a lens disposed on the surface at its position opposing the optical element, light traveling to or from the optical element passing the lens, the optical element being sealed by the package together with other leads, a height from a rear surface of the optical element supporting lead at its portion supporting the optical element to the rear surface of the package being set smaller than a height from the front surface of the optical element to a top of the lens, and outer ends of the leads including the optical element supporting lead being projected from one side surface of the package, wherein a height from the rear surface of the package to the rear surface of the leads including the optical element supporting lead and a height from the top of the lens to the front surfaces of the leads become substantially equal to each other seen from the side surface of the package from which the optical element supporting lead is projected.

The other objects, features and advantages of the present invention will become apparent from the following description of the embodiments thereof to be read in conjunction with the accompanying drawings through which like reference numerals designate like elements.

DETAILED DESCRIPTION OF THE PREFERRED EMBODIMENTS

Optical devices according to the embodiments of the present invention will be described with reference to the drawings.

Figure 2A:
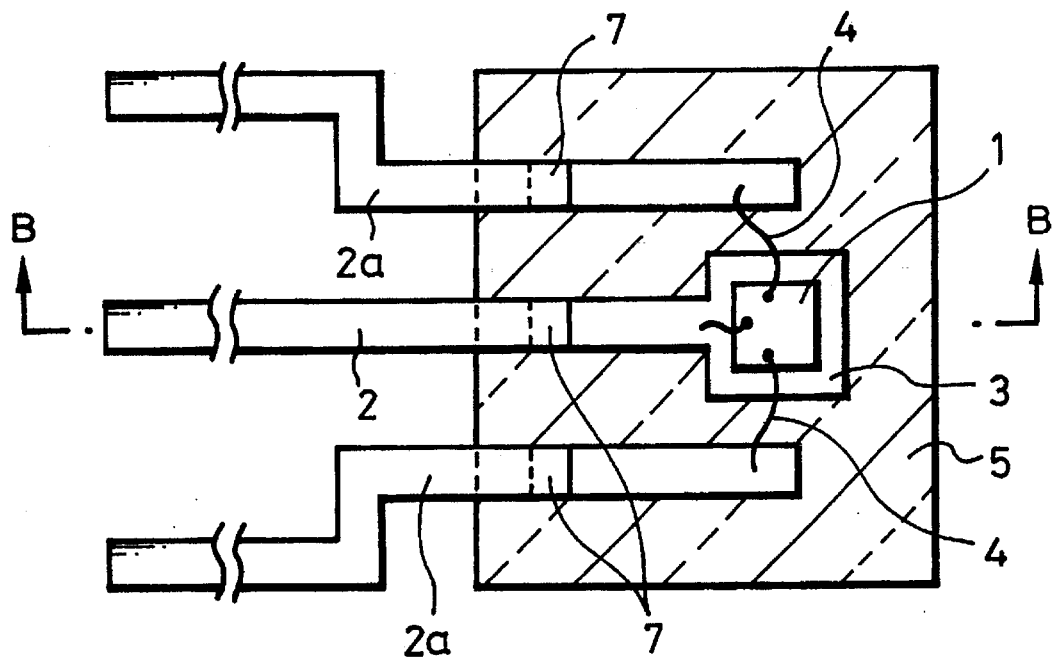
FIG. 2A is a cross-sectional plan view showing an optical device according to an embodiment of the present invention which is applied to a remote control reception module.
Figure 2B:
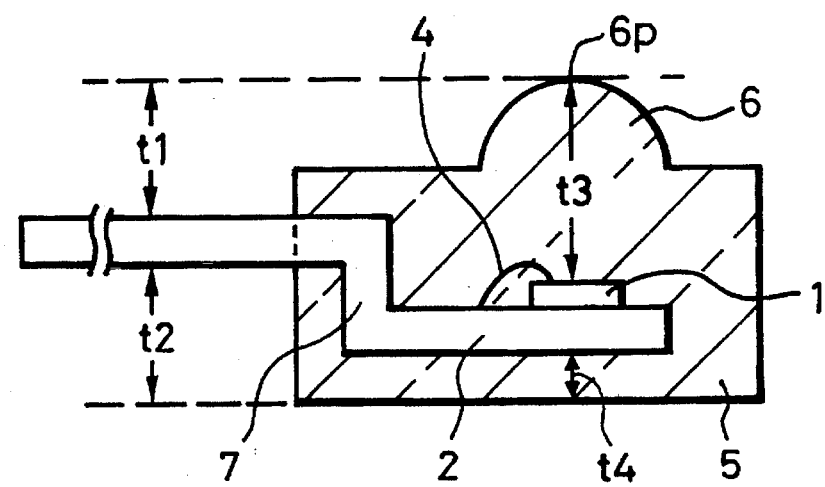
FIG. 2B is a cross-sectional view taken through the line B—B in FIG. 2A.

FIGS. 2A and 2B show a first embodiment of the optical device according to the present invention in which the present invention is applied to a remote control reception module. FIG. 2A is a cross-sectional plan view thereof and FIG. 2B is a cross-sectional view taken along the line B—B in FIG. 2A.

Figure 1:
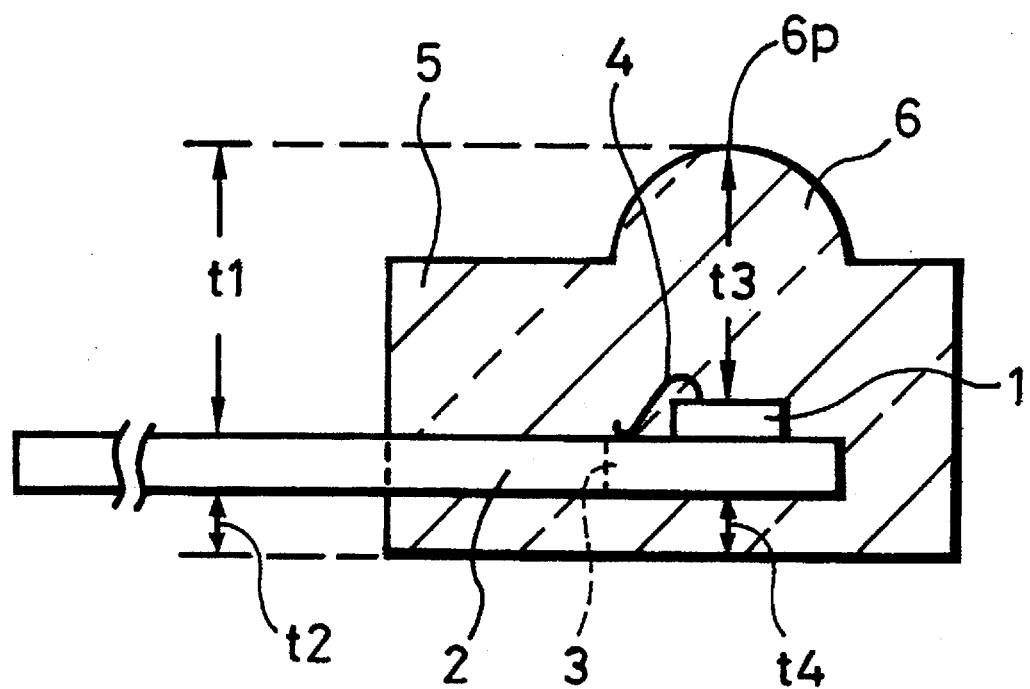
FIG. 1 is a cross-sectional view showing a remote control reception module package according to the related art.

The present optical device differs largely from the optical device shown in FIG. 1 in that respective leads are curved in a crank-fashion within a package. Except for this point, the present optical device and the optical device shown in FIG. 1 are made common. Therefore, since the common points are already described, they need not be described and only differences will be described. Throughout all the figures, like parts are marked with the same reference numerals and therefore need not be described.

The optical device supporting lead 2 of the inventive optical device is cranked at its intermediate portion between the portion projected from the side surface of the package 5 and the pad 3. Therefore, when the optical device is viewed from the side surface of the package 5 from which the optical device supporting lead 2 is projected, the height t2 ranging from the rear surfaces of leads 2, 2a, 2a including the optical device supporting lead 2 to the rear surface of the package 5 and the height t1 ranging from the top 6p of the lens 6 to the front surfaces of the leads 2, 2a, 2a are set to become substantially equal to each other. In FIGS. 2A and 2B, reference numerals 7, 7, 7 depict crank-shaped bending portions of the leads 2, 2a, 2a, respectively. The leads 2, 2a, 2a need not be always bent in a crank-shaped but may be bent in an S-letter shape.

In the respective leads 2, 2a, 2a at their portions deeper than the crank-shaped bending portions 7, 7, 7, the height t4 from the rear surface of each lead to the rear surface of the package 5 is set to a small value larger than 0 and less than 1 mm in order to escape air satisfactorily and to stabilize the lead position upon the resin shielding. Moreover, the height t3 from the surface of the remote control reception IC 1 to the top 6p of the lens 6 is set to 3 mm or greater such that the focus of the lens 6 is placed on the remote control reception IC 1.

According to the above optical device of the present invention, the height of the projected portion of each lead from the side surface of the package 5 is made such that the height t2 from the rear surface of each of the leads 2, 2a, 2a including the optical element supporting lead 2 to the rear surface of the package 5 becomes substantially equal to the height t1 from the top 6p of the lens 6 to the front surface of each of the leads 2, 2a, 2a. Therefore, the optical device can be assembled into the printed circuit board or the like by the above-mentioned insertion machine without trouble.

Accordingly, the optical device of the invention can be assembled into the printed circuit board or the like with less energy in a mass-production by the insertion machine.

While the above arrangement of the optical device is maintained, in the respective leads 2, 2a, 2a at their portions 7, 7, 7, the height t4 from the rear surfaces of the leads 2, 2a, 2a to the rear surface of the package 5 is set to a small value larger than, for example, 0 but less than 1 mm and the height t3 from the surface of the remote control reception IC 1 to the top 6p of the lens 6 is also set to, for example, 3 mm or greater so as to place the focus of lens 6 on the remote control reception IC 1 as in the prior art, so that there is no need to make the thickness of package 5 thicker and to lower the sensitivity of the remote control reception module. In other words, without limiting the dimension and characteristics of the optical device, it can be mass-produced with saved power.

It is not always necessary that the height t1 is completely equal to the height t2. However, as the difference therebetween becomes larger, the mis-generation rate in the work by the above insertion machine becomes high. Hence, it is most preferable that the difference between the heights t1 and t2 is less than 0.67 mm.

Figure 3:
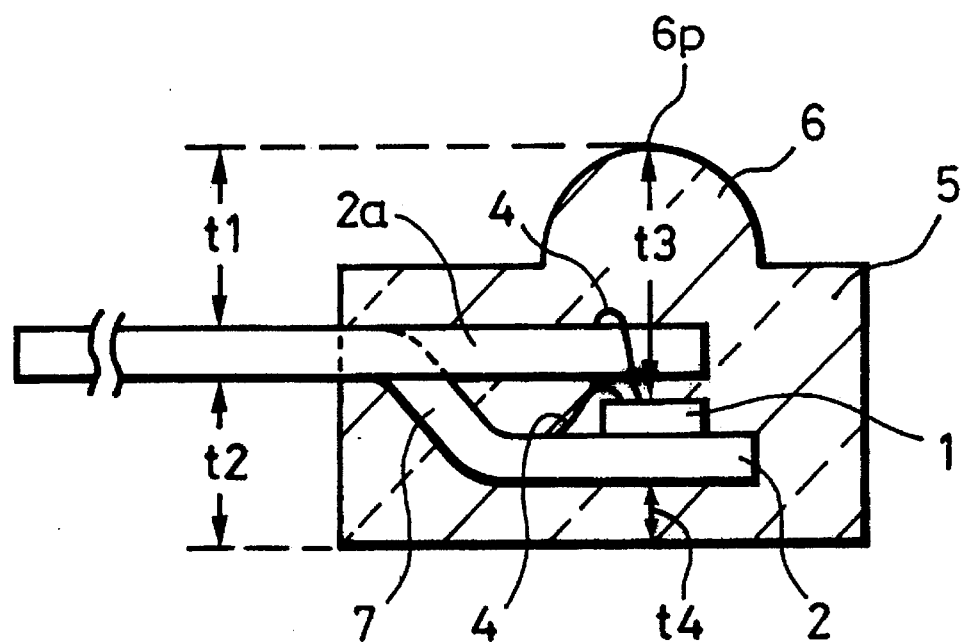
FIG. 3 is a cross-sectional view showing an optical device according to another embodiment of the present invention which is applied to the remote control reception module.

FIG. 3 is a cross-sectional view showing another embodiment of the present invention. In this embodiment, an S-letter-shaped bending portion 7 is formed in the optical device supporting lead 2 to make the height t4 from the rear surface of lead 2 to the rear surface of the package 5 small, while the height t3 from the surface of remote control reception IC 1 to the top 6p of lens 6 is set large to thereby position the focus of lens 6 on the surface of remote control reception IC 1. However, since the other leads 2a, 2a have no concerns about the focussing by lens 6, the leads 2a, 2a are not provided with any S-letter shaped bending portion. Therefore, the positions of leads 2a, 2a in their height direction within the package 5 are same as those outside the package 5.

As described just above, when no S-letter shaped bending portion is provided in the leads 2a, 2a other than the optical device supporting lead 2, the trouble caused by bending the leads can be reduced in its generation rate. That is, if the lead is bent and kept in the bending state, then there may be a fear that when molding the lead, the trouble generation ratio at the time of resin molding the lead becomes high a little. However, if the bending portion is formed only in the optical device supporting lead 2, it is possible to reduce the trouble generation ratio by bending the lead from being increased unnecessarily.

Although the number of the leads is three in the above embodiments, the present invention can be applied to a remote control reception module having the number of leads more than three.

Further, while in the above embodiments, on one IC chip 1 there are provided the photo-diode and the signal processing circuit, the present invention can be applied to such a case where a photo-diode (for example, a PIN photo-diode) and a signal processing circuit are provided in separate chips, respectively. In that case, the focus of lens 6 must be placed on the surface of the chip where the photo-diode is formed.

Also, a chip resistor and a chip capacitor, which are generally used as parts externally attached, may be sealed by the package 5 together with the remote control reception IC 1.

Further, the optical device according to the present invention can be applied to a device where a light emitting element is used an optical element. Specially, the present invention can be applied not only to a light receiving device such as the remote control reception module or the like but also to such a light emitting device in which as a light emitting element, a plane light emitting type diode or the like is used to emit the light emitted therefrom to the outside.

As described as above, in the optical device of the present invention, it is one of the features of the present invention that seen from the side surface of the package from which the optical device supporting lead is derived, the height from the rear surfaces of the respective leads including the optical device supporting lead to the rear surface of ten package is made substantially equal to the height from the front surfaces of the respective leads to the top of the lens.

Therefore, according to the optical device of the present invention, since the height of the deriving positions of respective leads including the optical device supporting lead from the rear surface of the package is set substantially a half of the height from the rear surface of the package to the top of the lens, the optical device can be assembled to the printed-circuit board or the like with no trouble by the above-mentioned insertion machine. Therefore, the assembly of the optical device to the printed-circuit board or the like becomes possible by using the insertion machine in saved power and mass-production.

Another feature of the present invention is that the height of the respective leads from the rear surface of the package within the same except for the optical device supporting lead is the same as the height of the respective leads on their projecting portion of the package from its rear surface. Therefore, the respective leads except for the optical device supporting lead have no need to be bent but only the optical device supporting lead has to be bent. Thus, the trouble generation ratio caused by bending the led can be reduced.

Having described preferred embodiments of the invention with reference to the accompanying drawings, it is to be understood that the invention is not limited to those precise embodiments and that various changes and modifications could be effected therein by one skilled in the art without departing from the spirit or scope of the novel concepts of the invention as defined in the appended claims.

What is claimed is:

1. An optical device comprising:

an optical element;

an optical element supporting lead for supporting said optical element; and a package having a lens disposed on a surface of the package at its position opposing said optical element, light traveling to or from said optical element passing said lens, said optical element being sealed by said package together with other leads, a height t4 from a rear surface of said optical element support lead at its portion supporting said optical element to the rear surface of said package being set smaller than a height t3 from the front surface of said optical element to a top of the lens, and outer ends of said leads including said optical element supporting lead being projected from one side surface of said package, wherein a height t2 from the rear surface of said package to the rear surfaces of said leads including said optical element supporting lead and a height t1 from the top of said lens to the front surfaces of said leads become substantially equal to each other as seen from the side surface of said package from which said optical element supporting lead is projected.

2. An optical device according to claim 1, wherein heights of leads other than said optical element supporting lead within the package from the rear surface of said package are made the same as those of the respective leads at their projecting portions from said package.

3. An optical device according to claim 1 or 2, wherein said optical element supporting lead is bent within said package.

4. An optical device according to claim 3, wherein said optical element supporting lead is bent in a crank shape or in an S-letter shape within said package.

5. An optical device according to claim 1, wherein said height t4 is set to be 1 mm or smaller and said height t3 is set to be 3 mm or greater.

6. An optical device according to claim 1, wherein a difference between said height t2 and said height t1 is set to be substantially 0.7 mm or smaller.

7. An optical device according to claim 1, wherein said package is mounted by using an insertion machine.

8. An optical device according to claim 1, wherein a chip resistor and a chip capacitor used as external assemblies are sealed into said package.

9. An optical device according to claim 1, wherein said optical element is formed of a light emitting element.

10. An optical device according to claim 1, wherein said optical element is formed of a photo-diode.

11. An optical device comprising:

an optical element;

an optical element supporting lead having at least a front surface, a side surface, a rear surface, a projecting surface, and a portion for supporting said optical element; and a package having a front surface, a rear surface, and a lens disposed on the front surface of the package at its position opposing said optical element, light traveling to or from said optical element passing said lens, said optical element being sealed by said package together with other leads, a height t4 from a rear surface of said optical element support lead at its portion supporting said optical element to the rear surface of said package being set smaller than a height t3 from the front surface of said optical element to a top of the lens, and outer ends of said leads including said projecting portion of said optical element supporting lead being projected from one side surface of said package, wherein a height t2 from the rear surface of said package to the rear surfaces of said leads including said optical element supporting lead and a height t1 from the top of said lens to the front surfaces of said leads become substantially equal to each other as seen from the side surface of said package from which said optical element supporting lead is projected.

12. An optical device according to claim 11, wherein heights of leads other than said optical element supporting lead within the package from the rear surface of said package are made the same as those of the respective leads at their projecting portions from said package.

13. An optical device according to claim 11 or 12, wherein said optical element supporting lead is bent within said package.

14. An optical device according to claim 3, wherein said optical element supporting lead is bent in a crank shape or in an S-letter shape within said package.

15. An optical device according to claim 11, wherein said height t4 is set to be 1 mm or smaller and said height t3 is set to be 3 mm or greater.

16. An optical device according to claim 11, wherein a difference between said height t2 and said height t1 is set to be substantially 0.7 mm or smaller.

17. An optical device according to claim 11, wherein said package is mounted by using an insertion machine.

18. An optical device according to claim 11, wherein a chip resistor and a chip capacitor used as external assemblies are sealed into said package.

19. An optical device according to claim 11, wherein said optical element is formed of a light emitting element.

20. An optical device according to claim 11, wherein said optical element is formed of a photo-diode.

* * * * *